United States Patent [19]

Baba et al.

[11] Patent Number: 4,653,027

[45] Date of Patent: Mar. 24, 1987

[54] SEMICONDUCTOR MEMORY DEVICE

[75] Inventors: Fumio Baba; Hirohiko Mochizuki; Hatsuo Miyahara, all of Kawasaki, Japan

[73] Assignee: Fujitsu Limited, Kanagawa, Japan

[21] Appl. No.: 677,580

[22] Filed: Dec. 3, 1984

[30] Foreign Application Priority Data

Dec. 1, 1983 [JP] Japan ............................. 58-227372

[51] Int. Cl.$^4$ .......................................... G11C 7/00
[52] U.S. Cl. .................................. 365/189; 365/205
[58] Field of Search ..................... 365/189, 230, 205

[56] References Cited

U.S. PATENT DOCUMENTS 3,969,706 7/1976 Proebsting et al. ............... 365/230

Primary Examiner—James W. Moffitt
Attorney, Agent, or Firm—Staas & Halsey

[57] ABSTRACT

A semiconductor memory device operated synchronously with clock signals, such as a MOS dynamic RAM device. The semiconductor memory device includes a switch circuit inserted between a prestage output amplifier circuit receiving a readout signal from a memory cell and an output buffer circuit. The switch circuit is turned on just before the output signal is supplied from the prestage output amplifier circuit to the output buffer circuit and turned off after the output condition of the output buffer circuit is settled. The potential corresponding to the output data is maintained in the circuit between the switch circuit and the output buffer circuit. The output condition of the output buffer circuit is therefore retained even during the reset period of the prestage drive circuit, and the duration period of the output signal is expanded.

9 Claims, 9 Drawing Figures

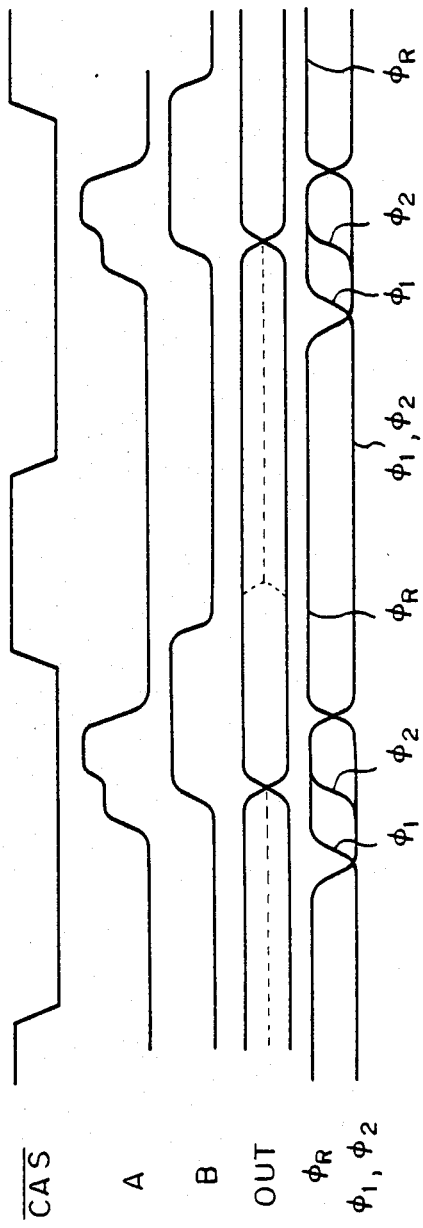

SEMICONDUCTOR MEMORY DEVICE

BACKGROUND OF THE INVENTION

The present invention relates to a semiconductor memory device operated synchronously with clock signals, and more particularly to an output circuit used therein to expand the duration period of the output signal.

In a conventional semiconductor memory device controlled by clock signals such as a metal-oxide semiconductor (MOS) dynamic memory device, since the output signal is output and shut off synchronously with the turning on and off of a clock signal, such as a column address strobe signal, respectively, the duration period of the output signal is short when the frequency of the clock signals is high. Therefore, it is impossible to make the frequency of the clock signals too high, limiting the operation speed of the memory device.

SUMMARY OF THE INVENTION

In order to eliminate the above-mentioned drawbacks of a conventional memory device, the present invention adopts the idea of adding a simple switch circuit to an output buffer circuit to give the output buffer circuit a latching function.

It is an object of the present invention to increase the length of output signals as much as possible without decreasing the frequency of clock pulses, thereby increasing the operating speed of a memory device.

According to the present invention, there is provided a semiconductor memory device including: a prestage output amplifier circuit receiving a readout signal from a memory cell; an output buffer circuit receiving the output signal of the prestage output amplifier circuit; and a switch circuit inserted between the prestage output amplifier circuit and the output buffer circuit, the switch circuit being turned on just before a drive signal is supplied from the prestage output amplifier circuit to the output buffer circuit and turned off after the output condition of the output buffer circuit is settled. The potential corresponding to the output data is maintained in the circuit between the switch circuit and the output buffer circuit. Therefore, the output condition of the output buffer circuit is retained even during the reset period of the prestage drive circuit.

BRIEF DESCRIPTION OF THE DRAWINGS

FIG. 8 is a waveform diagram of the operation of the memory device of FIG. 6.

DESCRIPTION OF THE PREFERRED EMBODIMENTS

Before describing the preferred embodiments, an explanation will be given of a conventional semiconductor memory device in reference to FIGS. 1 through 5.

Figure 1:
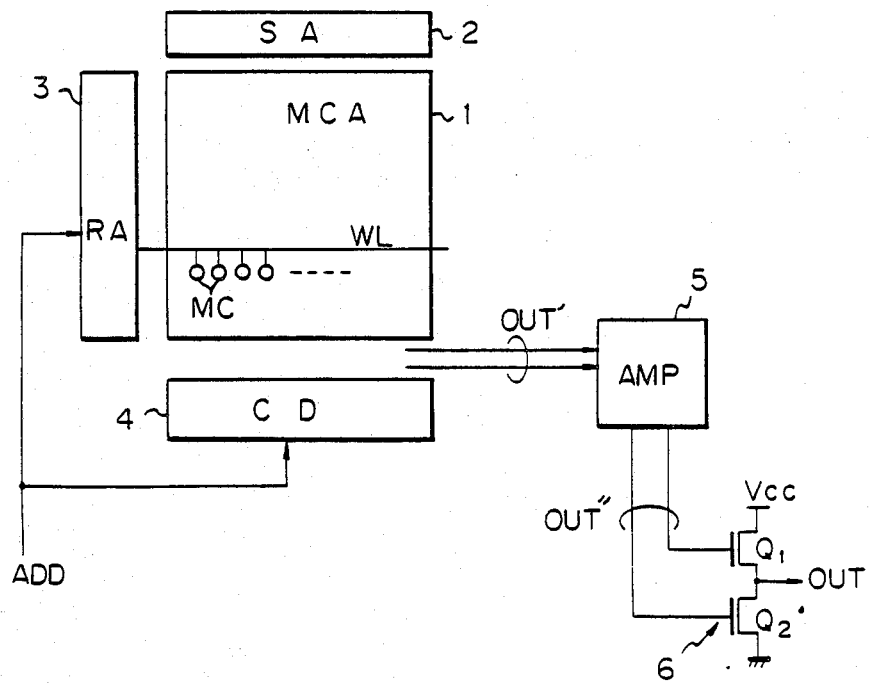
FIG. 1 is a schematic structural diagram of a conventional dynamic random access memory (RAM) device.

FIG. 1 is a schematic block diagram of a conventional dynamic RAM device. In the drawing, reference numeral 1 designates a memory cell array (MCA) having a matrix arrangement wherein memory cells are connected to each of the intersections of a plurality of word lines WL and bit lines (not shown). Reference numeral 2 designates a sense amplifier, 3 a row decoder, 4 a column decoder, 5 an output amplifier, and 6 an output buffer circuit including MOS output transistors, $Q_1$ and $Q_2$.

Figure 2:
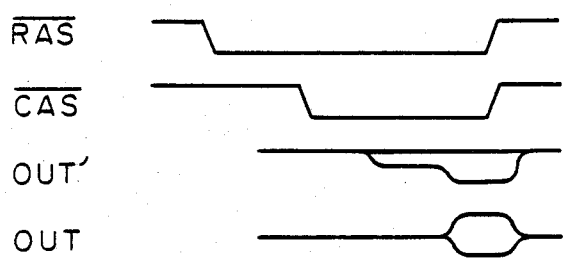
FIGS. 2 through 5 are waveform diagrams of the operation of the RAM device of FIG. 1.

Clock pulses used in the above-mentioned RAM device typically include, as shown in FIG. 2, an $\overline{RAS}$ (row address strobe) signal and $\overline{CAS}$ (column address strobe) signal which define both the active period of the device and the timing of reading of external address signals. These two strobe signals are used to control the so called address multiplex system wherein two groups of address signals are provided via common address lines in a manner of time division. A dynamic RAM device other than the above-mentioned type may be controlled by a single strobe signal. In the memory device of FIG. 1, information from all the memory cells MC connected to the word line WL selected by the row decoder 3 is amplified and retained by the sense amplifier 2. One unit of the information is selected by the column decoder 4 and is sent to the output amplifier 5. OUT' are the complementary output signals of the sense amplifier 2. One of the pair of the output signals OUT' is maintained in an H (high) potential level, and the other becomes an L (low) potential level. Of course, these H or L levels of the output signals OUT' are determined depending on the data "1" or "0" stored in the selected memory cell. The output amplifier 5 amplifies the output signals OUT' and drives the output transistors $Q_1$ and $Q_2$ by using the amplified outputs OUT" thereof. These MOS transistors $Q_1$ and $Q_2$ are serially connected between a power source $V_{CC}$ and the ground and generate an H level output signal OUT when the transistor $Q_1$ is turned on and the transistor $Q_2$ is turned off and an L level output signal OUT when the transistor $Q_1$ is turned off and the transistor $Q_2$ is turned on. This output signal OUT is the output signal finally obtained. When the clock $\overline{CAS}$ rises, the output signal OUT is shut off because the amplifier 5 is reset in this time.

As shown in FIG. 2, when the signal $\overline{RAS}$ is, at first, generated, i.e., rendered the L potential level to initiate the active period, the row address data is read into the row decoder 3 in response to the falling edge of the signal $\overline{RAS}$ to the L potential level, whereby a word line WL is selected. Then, the signal $\overline{CAS}$ is rendered the L potential level and column address data is read into the column decoder 4 in a similar manner, so that bit line selection is performed. The output signals OUT' of the memory cell arranged at the intersection between the thus selected word line and bit line appear after a short delay, and, thereafter, the output signal OUT is generated. When the signal $\overline{CAS}$ is released, this output signal OUT is also released after a short delay. These operations are repeated in accordance with the next generation of the signals $\overline{RAS}$ and $\overline{CAS}$.

Figure 3:
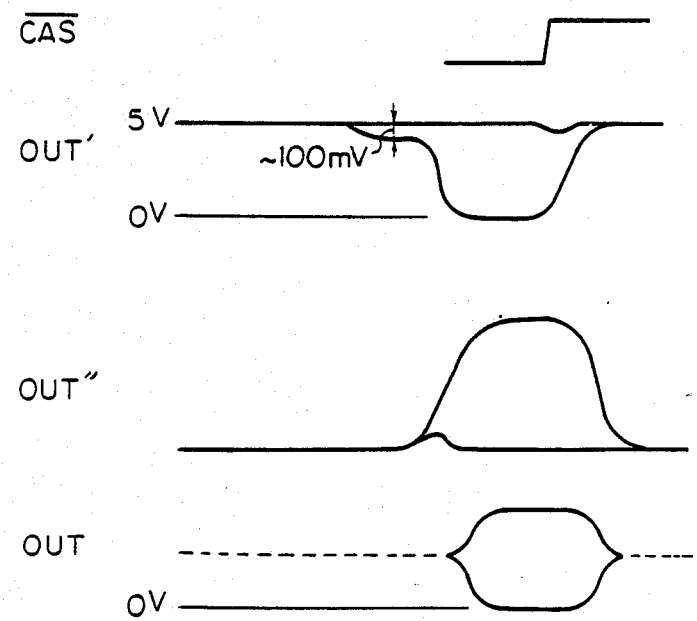

FIG. 3 is an enlarged view showing the output signals OUT', OUT", and OUT. When the final output signal OUT is shut off, both the transistors $Q_1$ and $Q_2$ are turned off and become the high impedance status, i.e., open status.

As apparent from the above description and the drawings, the duration period of the output signal OUT is relatively short when compared with the pulse widths of the clock signals $\overline{RAS}$ and $\overline{CAS}$. The duration period of the output signal OUT becomes shorter when the clock frequency becomes higher. If the duration period becomes too small, the external circuit connected to the memory device cannot respond to the output signal OUT. Therefore, in a conventional memory device, it is impossible to greatly increase the clock frequency.

Various operating modes of a memory device are known for a high-speed access operation. One of them is the page mode and the other is the nibble mode.

Figure 4:
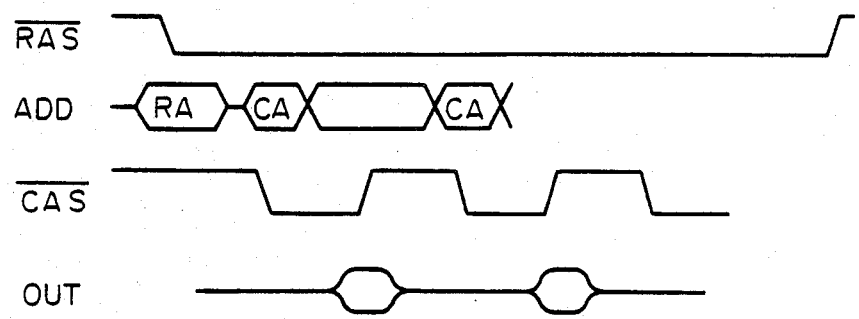

FIG. 4 illustrates the readout operation in the page mode. In this mode, row address data RA is read in at the falling edge of the row address strobe signal $\overline{RAS}$. Thereafter, a plurality of column address data CA used together with the row address data RA are continuously read in at the falling edges of the column address strobe signal $\overline{CAS}$. Therefore, a plurality of memory cells commonly connected to a selected word line are sequentially accessed, and the readout data is successively output as the output signal OUT. In this case, each output signal OUT is generated a short time after the falling of the column address strobe signal $\overline{CAS}$ and is eliminated a short time after the rising of the signal $\overline{CAS}$.

Figure 5:
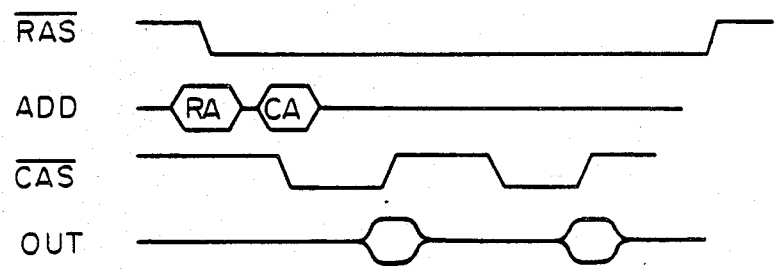

FIG. 5 illustrates the readout operation in the nibble mode. In this mode, a row address RA is read in at the falling edge of the signal $\overline{RAS}$ and a column address CA is read in at a falling edge of the signal $\overline{CAS}$. Thereafter, it is possible to continuously obtain the output signal OUT of, for example, four bits having continuous column addresses, only by turning on and off the signal $\overline{CAS}$. This operation is performed by operating a counter which counts the signals $\overline{CAS}$ and by generating column addresses which are +1, +2, ... of the first read-in column address CA.

In these modes, the output signal OUT is eliminated a short time after the rising of the signal $\overline{CAS}$. This is because internal circuits are reset at that timing to prepare for the next readout operation. Therefore, the duration period of the output signal OUT becomes relatively short. As mentioned above, if the duration period is too short, it is impossible to use the output signal OUT in external circuits. Thus, in the conventional memory device, it is practically necessary to determine the lower limit of the period of the clock signals, whereby the high-speed operation of the memory device is deteriorated.

According to the present invention, there is provided a semiconductor memory device which overcomes these problems.

Figure 6:
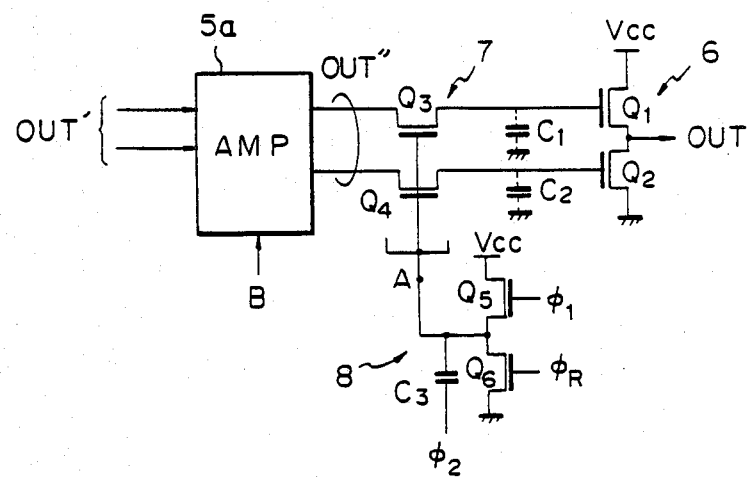
FIG. 6 is a partial circuit diagram of a semiconductor memory device as an embodiment of the present invention.

FIG. 6 illustrates an output portion of a memory device as an embodiment of the present invention. In the embodiment, the circuit of FIG. 6 is used in place of the output amplifier 5 and the output buffer circuit 6 of the circuit of FIG. 1. In FIG. 6, reference numeral 7 designates a switch circuit composed of MOS transistors $Q_3$ and $Q_4$ for a switching operation, which is inserted into the path from an output amplifier $5a$ to an output buffer circuit 6. These transistors $Q_3$ and $Q_4$ are controlled by an output signal A of a switch drive circuit 8, which includes totempole connected MOS transistors $Q_5$ and $Q_6$ and a bootstrap capacitor $C_3$, and which is operated by clock pulses $\phi_1$, $\phi_R$, and $\phi_2$. The output amplifier $5a$ is activated and reset by a clock pulse B applied thereto.

Figure 7:
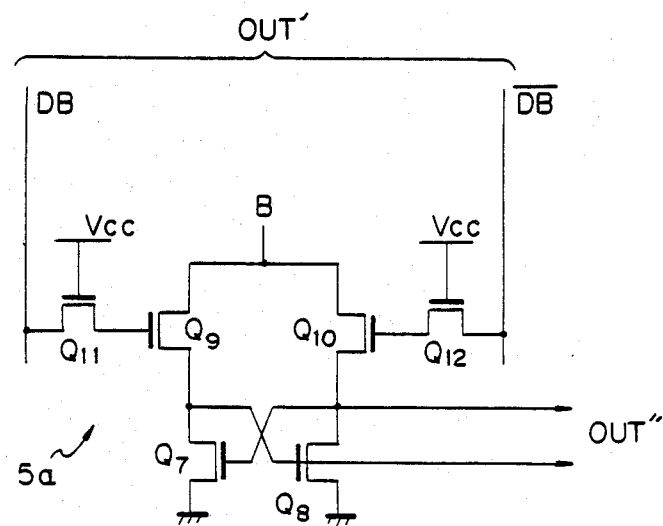
FIG. 7 is an electric circuit diagram of an output amplifier used in the memory device of FIG. 6.

As illustrated in FIG. 7, the output amplifier $5a$ includes MOS driver transistors $Q_7$ and $Q_8$ which are mutually cross-coupled at the gates and drains, load transistors $Q_9$ and $Q_{10}$ connected to the drains of the transistors $Q_7$ and $Q_8$, respectively, and input transistors $Q_{11}$ and $Q_{12}$ inserted between the gate of the transistor $Q_9$ and a data bus DB and between the gate of the transistor $Q_{10}$ and a data bus $\overline{DB}$, respectively. The data buses DB and $\overline{DB}$ are used to supply an output signal OUT' from the sense amplifier to the output amplifier $5a$.

The operation of the circuits of FIGS. 6 and 7 is explained with reference to FIG. 8, illustrating waveforms of signals appearing in these circuits.

The clock signal A generated by the switch drive circuit 8 rises in response to the turning on of the transistor $Q_5$ caused by the rising of a clock signal $\phi_1$. Thereafter, the clock signal A falls in response to the turning on of the transistor $Q_6$ caused by the turning on of a clock signal $\phi_R$ after the turning off of the clock signal $\phi_1$. A clock signal $\phi_2$ is a pulse signal slightly delayed from the clock signal $\phi_1$ and is used to completely turn on the transistors $Q_3$ and $Q_4$ by utilizing the bootstrap effect caused by raising the potential of a point A higher than or equal to $V_{CC}$. The switch drive circuit 8 is provided commonly for all output buffers, and, therefore, only two additional elements are needed for all output buffers.

The clock signal B rises shortly after the rising of the clock signal A. When the clock signal B rises and the output amplifier $5a$ is activated, the output signal OUT' is applied to and amplified by the flip-flop circuit having the transistors $Q_7$ and $Q_8$. Thereby, an output signal OUT" is generated in response to the output signal OUT'. Just before the output signal OUT" is generated, the clock signal A is changed from the L to H level and the transisistors $Q_3$ and $Q_4$ are turned on. The potentials of the gates of both transistors $Q_1$ and $Q_2$ become low immediately after the turn-on of transistors $Q_3$ and $Q_4$ because the clock signal B is at a low level at this time. Then the clock signal B rises to generate the output signal OUT". Consequently, the output transistors $Q_1$ and $Q_2$ are operated by the output signal OUT" applied to the gates thereof. After the output signal OUT is generated, the clock signal A is turned off before the falling of the clock signal B, and the output amplifiers $5a$ and the output buffer circuit 6 are separated, so that the H or L level of the output signal OUT" is maintained by parasitic capacitors $C_1$ and $C_2$. Thereby, the status of the output transistors $Q_1$ and $Q_2$ and, therefore, the output signal OUT is retained in the same condition until the transistors $Q_3$ and $Q_4$ are turned on at the next cycle. The output amplifier $5a$ is reset at the falling edge of the clock signal B.

Thus, in the memory device according to the present invention, the output signal OUT is retained to the time the next output signal is generated, as shown by the solid lines of FIG. 8. On the other hand, the output signal OUT of the conventional memory device is eliminated just after the reset of the output amplifier 5, as shown by the dotted lines of FIG. 8.

In the circuit of FIG. 6, when the clock signal A falls and the transistors $Q_3$ and $Q_4$ are turned off, the gate circuits of the transistors $Q_1$ and $Q_2$ assume the open circuit status, and the potentials of the gate circuits are retained only by the parasitic capacitors $C_1$ and $C_2$.

Figure 9:
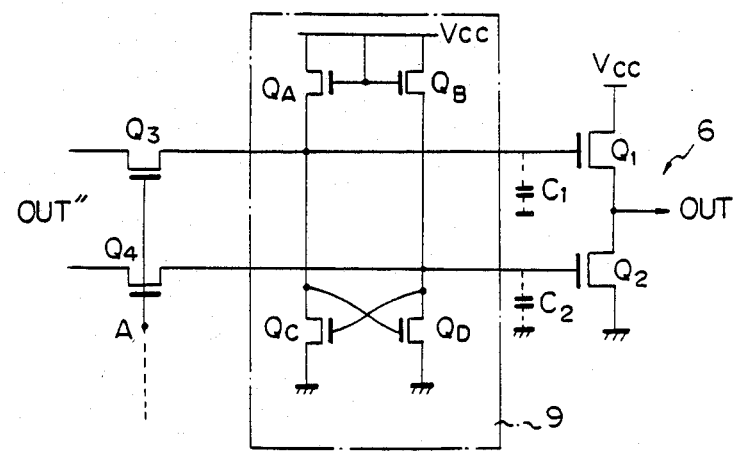
FIG. 9 is a partial circuit diagram of a modified example of the memory device of FIG. 6.

In order to surely and reliably retain the potentials of the gate circuit in the H or L potential level, it is effective to provide a level ensuring circuit or latch circuit, as illustrated in FIG. 9. In FIG. 9, the circuit surrounded by a frame 9 of dot-dash lines is the level ensuring circuit. This is composed of a flip-flop circuit having load transistors $Q_A$ and $Q_B$ and driver transistors $Q_C$ and $Q_D$. When the output signal OUT" is in a condition wherein the potential of the transistor $Q_3$ side circuit is H, and the potential of the transistor $Q_4$ side circuit is L, the transistor $Q_D$ is turned on and the transistor $Q_C$ is turned off. Therefore, even when the transistors $Q_3$ and $Q_4$ are turned off, the potential H or L applied to each of the gates of the output transistors $Q_1$ and $Q_2$ is retained with certainty in the same condition as that obtained when the transistors $Q_3$ and $Q_4$ are turned on. Similarly, when the output signal OUT" is in a condition wherein the potential of the transistor $Q_3$ side circuit is L and the potential of the transistor $Q_4$ side circuit is H, the transistor $Q_C$ is turned on and the transistor $Q_D$ is turned off, and thereby the H and L level conditions are maintained even when the transistors $Q_3$ and $Q_4$ are turned off. Thus, the transistors $Q_A$ and $Q_B$ operate as an H level ensuring circuit, and the transistors $Q_C$ and $Q_D$ operate as an L level ensuring circuit.

As mentioned above, according to the present invention, it is possible to provide a latching function to an output buffer circuit by using a simple circuit structure. Therefore, the frequency of clock signals can be made considerably high, and the readout operation of a semiconductor memory device, such as a MOS dynamic RAM device, using the clock signals can be performed at a high speed.

We claim:

1. A semiconductor memory device comprising:
   a prestage output amplifier circuit receiving a readout signal from a memory cell, having a reset period for being reset according to a reset signal supplied thereto, and supplying a respective output signal between respective reset periods;
   an output buffer circuit for receiving each said output signal of said prestage output amplifier circuit;
   a switch circuit inserted between said prestage output amplifier circuit and said output buffer circuit for supplying therebetween each said output signal of said prestage output amplifier circuit, and
   a switch circuit control means, operatively connected to said switch circuit, for controlling said supplying of said output signal from said prestage output amplifier circuit to said output buffer circuit by said switch circuit, by turning said switch circuit on just before said output signal is supplied from said prestage output amplifier circuit to said output buffer circuit, and for turning off said switch circuit after a respective output condition of said output buffer circuit, corresponding to the respective output signal from said prestage output amplifier circuit, is settled;
   wherein a potential corresponding to the respective output signal from said prestage output amplifier circuit is maintained between said switch circuit and said output buffer circuit and the output condition of said output buffer circuit are maintained, during each said reset period of said prestage output amplifier circuit.

2. A semiconductor memory device according to claim 1, wherein said switch circuit control means comprises a switch drive circuit for supplying a drive signal for the turning on and off of said switch circuit.

3. A semiconductor memory device according to claim 2, wherein said switch drive circuit comprises totempole connected MOS transistors connected in common at a coupling point and driven by clock signals having opposite polarities, and a bootstrap capacitor which is connected to the coupling point of said MOS transistors and which is driven by a clock signal, so as to increase the amplitude of said drive signal supplied to said switch circuit.

4. A semiconducter memory device according to claim 1, comprising a latch circuit inserted between said switch circuit and said output buffer circuit, for retaining said output signal supplied from said prestage output amplifier circuit via said switch circuit after said switch circuit is turned off.

5. A semiconductor memory device according to claim 4, wherein said latch circuit comprises a flip-flop circuit having a pair of driver transistors cross-coupled with each other at their gates and drains and a pair of load means connected to the drains of said driver tranistors.

6. A semiconductor memory device according to claim 5, wherein a pair of lines with complementary signals supply said output signal from said prestage output amplifier circuit, said pair of load means maintain the respective one of said pair of lines at a high logic level, and said pair of driver transistors maintain the other of said pair of lines at a low logic level.

7. A semiconductor memory device according to claim 1, comprising
   data busses for supplying said readout signal from a memory cell to said prestage output amplifier circuit; and
   said prestage output amplifier circuit including a pair of driver transistors mutually cross-coupled at their gates and drains, a pair of load transistors connected to the drains of said driver transistors, and a pair of input transistors inserted between the gates of said load transistors and said data busses
   wherein said prestage output amplifier is actuated by applying a clock signal to the drains of said load transistors.

8. A semiconductor memory device according to claim 1, wherein:
   said output signal of said prestage output amplifier circuit includes a pair of complementary data signals; and
   said switch circuit comprises a pair of MOS transistors for switching said pair of complementary data signals.

9. A semiconductor memory device according to claim 1, wherein said output condition of said output buffer circuit, corresponding to each respective output signal from said prestage output amplifier circuit, is maintained until the time for the output condition thereof to assume the value corresponding to the next successive output signal from said prestage output amplifier circuit.

* * * * *

UNITED STATES PATENT AND TRADEMARK OFFICE
CERTIFICATE OF CORRECTION

PATENT NO. :    4,653,027
DATED      :    March 24, 1987
INVENTOR(S) :   Baba et al.

It is certified that error appears in the above-identified patent and that said Letters Patent is hereby corrected as shown below:

FRONT PAGE, [73] "Kanagawa" should be --Kawasaki--.

Signed and Sealed this

Eighteenth Day of August, 1987

*Attest:*

DONALD J. QUIGG

*Attesting Officer*   *Commissioner of Patents and Trademarks*